United States Patent [19]

Matsui et al.

[11] Patent Number: 4,929,494

[45] Date of Patent: May 29, 1990

[54] FIBROUS SUBSTRATES IMPREGNATED WITH A CURABLE COMPOSITION

[75] Inventors: Fumio Matsui; Noboru Suzuki, both of Kanagawa; Minoru Takaishi, Tokyo; Ryushi Ogura, Gunma; Noriaki Harigai, Saitama; Tadayoshi Hashimoto; Tomoe Uematu, both of Kanagawa, all of Japan

[73] Assignee: Showa Denko Kabushiki Kaisha, Tokyo, Japan

[21] Appl. No.: 117,605

[22] Filed: Nov. 6, 1987

[30] Foreign Application Priority Data

| Mar. 5, 1986 | [JP] | Japan | 61-48902 |
| Nov. 7, 1986 | [JP] | Japan | 61-266121 |
| Nov. 7, 1986 | [JP] | Japan | 61-266129 |
| Nov. 13, 1986 | [JP] | Japan | 61-270069 |
| Nov. 13, 1986 | [JP] | Japan | 61-270071 |
| Nov. 14, 1986 | [JP] | Japan | 61-272441 |
| Mar. 5, 1987 | [JP] | Japan | 62-48903 |
| Mar. 5, 1987 | [JP] | Japan | 62-48904 |
| Apr. 16, 1987 | [JP] | Japan | 62-92035 |
| Apr. 16, 1987 | [JP] | Japan | 62-92036 |
| Aug. 13, 1987 | [JP] | Japan | 62-200895 |
| Aug. 13, 1987 | [JP] | Japan | 62-200896 |
| Aug. 13, 1987 | [JP] | Japan | 62-200897 |
| Aug. 13, 1987 | [JP] | Japan | 62-200898 |

[51] Int. Cl.$^5$ .................. B32B 27/00; B32B 27/38
[52] U.S. Cl. .................. 428/286; 428/287; 428/414; 428/418; 428/442; 428/451; 428/514; 428/522
[58] Field of Search ............... 428/418, 414, 442, 514, 428/522, 286, 287, 451

[56] References Cited

U.S. PATENT DOCUMENTS

| 3,897,588 | 7/1975 | Mohtomi | 428/418 |
| 3,902,951 | 9/1975 | Doi et al. | 156/313 |
| 4,440,833 | 4/1984 | Franz et al. | 428/464 |
| 4,451,597 | 5/1984 | Victorius | 428/418 |
| 4,477,512 | 10/1984 | Thomas et al. | 428/418 |

FOREIGN PATENT DOCUMENTS

| 0078407 | 5/1983 | European Pat. Off. |
| 0176979 | 4/1986 | European Pat. Off. |
| 0199671 | 10/1986 | European Pat. Off. |
| 2328741 | 5/1977 | France |
| 1281898 | 7/1972 | United Kingdom |

Primary Examiner—P. C. Ives
Attorney, Agent, or Firm—Sughrue, Mion, Zinn, Macpeak & Seas

[57] ABSTRACT

A laminate is disclosed, comprising substrates which are impregnated with a curable composition, laminated and cured, wherein the curable composition comprises (i) a curable prepolymer having a main chain consisting essentially of a random copolymer of a vinyl monomer and an acrylic or methacrylic monomer, and a side chain containing an acryloyl or methacryloyl group at the terminal, as a main component, and (ii) a crosslinkable vinyl monomer.

23 Claims, No Drawings

FIBROUS SUBSTRATES IMPREGNATED WITH A CURABLE COMPOSITION

FIELD OF THE INVENTION

The present invention relates to laminates for use in production of metallic foil-covered laminates which are to be used as electric devices, electronic devices, communication devices and so forth.

BACKGROUND OF THE INVENTION

Typical examples of resins which are used in metallic foil-covered laminates are phenol resins, epoxy resins, unsaturated polyester resins and so forth, as described, for example, in U.S. Pat. Nos. 3,902,951, 3,897,588 and 4,440,833. They are used in the form of composite materials in combination with various substrates.

In general, these laminates have been produced by use of phenol resins with paper as a substrate or epoxy resins with a glass cloth as a substrate, under pressure, by heat curing In these cases, however, material costs and equipment costs are high, and further the processes are complicated. Furthermore, in accordance with the above press molding method, surface roughness of a sheet or plate to press the laminates is transferred to the laminate surface and, therefore, it is necessary to apply brushing onto the laminate surface. In order to solve the above problems, a method has been recently developed in which a paper substrate is impregnated with liquid unsaturated polyester resins and continuously molded and cured by heating. However, copper-covered laminates using unsaturated polyester resins are inherently poor in heat resistance, and thus when the laminates are dipped in a solder bath for a long time, they deform to such an extent that they are difficult to be handled. This disadvantage reduces the reliability concerning the durability of the products and inhibits the widespread use of the laminates. In order to overcome the above problem, Japanese Patent Application (OPI) No. 46970/80 (the term "OPI" as used herein means a "published unexamined patent application") discloses that combinations of monofunctional hydrocarbon monomers and polyfunctional hydrocarbon monomers are used as crosslinkable monomer for unsaturated polyesters. However the problem has not yet been sufficiently overcome.

Resins known as vinyl ester resins are not widely used in laminates although they are excellent in physical properties of the cured products thereof.

Conventional vinyl ester resins have a molecular weight of several hundreds to 2,000. In impregnation of paper or glass substrate and heat curing, the resins flow seriously from the substrates, and furthermore in addition of other monomers, a considerable reduction in viscosity occurs.

In order to solve the above problems, a method of compounding silica for the purpose of imparting thixoviscosity has been employed. Imparting thixoviscosity, however, undesirably lowers a rate of impregnation to substrates such as paper or glass.

Furthermore the vinyl ester resins are made mainly of epoxy acrylate and, therefore, they are relatively expensive and have not been widely used.

SUMMARY OF THE INVENTION

An object of the present invention is to provide laminates which are excellent in electric characteristics, mechanical characteristics and punching characteristics.

It has been found that a curable prepolymers having a main chain made of a random copolymer of vinyl monomers and acryloyl or methacryloyl monomers and side chains having an acryloyl or methacryloyl group in the terminal thereof have good electric and mechanical characteristics, are excellent in compatibility with various compounding monomers and additives, and are suitable for impregnation molding.

The present invention relates to a laminate comprising substrates which are impregnated with a curable composition, laminated and cured, the curable composition comprising (i) a curable prepolymer having a main chain consisting essentially of a random copolymer of a vinyl monomer and an acrylic or methacrylic monomer and a side chain containing an acryloyl or methacrylol group at the terminal, as a main component, and (ii) a crosslinkable vinyl monomer.

DETAILED DESCRIPTION OF THE INVENTION

Curable prepolymers which are preferably used in the present invention are represented by formulae (I), (II) and (III):

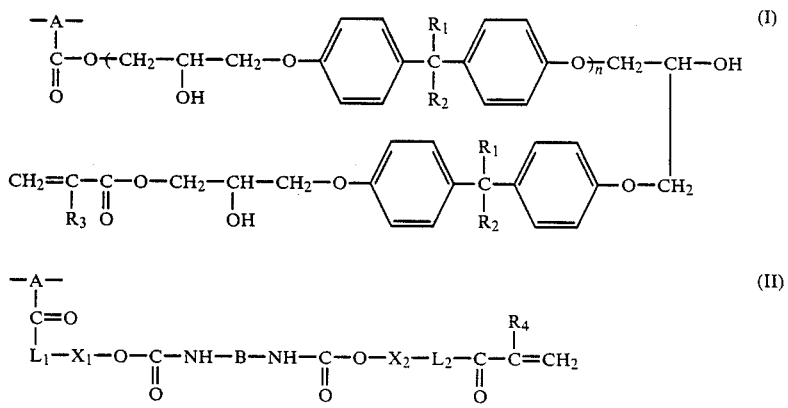

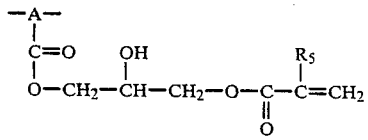

wherein A represents a main chain portion made of a random copolymer of a vinyl monomer and an acryloyl or methacryloyl (hereinafter collectively referred to as "(meth)acryloyl") monomer, $R_1$ to $R_5$ each represents a hydrogen atom or a methyl group, $X_1$ and $X_2$ each represents a hydrocarbon group having 1 to 16 carbon atoms or a hydrocarbon group linked with an ether bond and having 1 to 16 carbon atoms in total, B represents an aliphatic, alicyclic or aromatic hydrocarbon group having up to 20 carbon atoms, $L_1$ and $L_2$ each represents —O— or —NH—, and n is 0 or an integer of 1 to 5.

In formula (II), the hydrocarbon group for $X_1$ and $X_2$ includes an alkylene group and an alkenylene group, such as a methylene group, an ethylene group, a propylene group, and a hexamethylene group, and the hydrocarbon group may contain up to 10 ether bonds therein. The hydrocarbon group preferably has 1 to 3 carbon atoms. The aliphatic, alicyclic or aromatic hydrocarbon group for B includes an alkylene group, an alkenylene group, and an arylene group, such as a methylene group, an ethylene group, a propylene group, a hexamethylene group, a phenylene group, a methylphenylene group, a naphthalene group, and

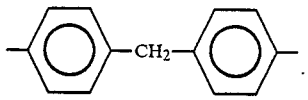

The density of the side chain having a (meth)acryloyl group at the terminal thereof in the curable prepolymer is generally from 0.1/1 to 20/1 and preferably 1/1 to 10/1 in terms of the molar ratio of the vinyl monomer constituting a part of the main chain to the terminal (meth)acryloyl group.

The weight average molecular weight of the main chain polymer represented by A in formulae (I), (II) and (III) is usually 2,000 to 200,000. Preferably it is 3,000 to 200,000.

As the vinyl monomers to be used to form the main chain portion represented by A, any vinyl monomers capable of copolymerizable with the (meth)acryloyl monomer to which the side chain is introduced can be used.

Typical examples of such vinyl monomers are styrene, α-methylstyrene, chlorostyrene, vinyltoluene, acrylic acid esters (e.g., methyl, ethyl, butyl, isobutyl, tert-butyl, 2-ethylhexyl, and octyl esters), methacrylic acid esters (e.g., methyl, ethyl, propyl, butyl, isobutyl, tert-butyl, 2-ethylhexyl, lauryl, benzyl, cyclohexyl, tetrahydrofurfuryl, and dicyclopentenyl esters), vinyl acetate, vinyl propionate, vinylidene chloride, vinyl chloride, vinyl bromide, acrylonitrile, ethylene, propylene, butadiene and vinyl ester of Versatic Acid (trade name: produced by Shell Chemical Co.).

A method of preparation of the curable prepolymers represented by formula (I) which are used in the present invention is shown below.

(i) First, a desired amount of (meth)acrylic acid and an epoxy resin, the equivalent ratio of epoxy group to (meth)acryloyl group being more than 1/1, are reacted in the presence of a catalyst such as tert-amines, amine salts, quaternary ammonium salts and metal salts, or in the absence of a catalyst, to form an unsaturated group-containing epoxy resin (A) which contains a (meth)acryloyl group and an epoxy group in the molecule thereof.

(ii) Then the necessary amount of vinyl monomer is added, and the vinyl monomer is radical-polymerized with the (meth)acryloyl group of the unsaturated group-containing epoxy resin (A) in the presence of an initiator, e.g., azobisisobutyronitrile, organic peroxides, to form a reaction mixture containing prepolymers having an epoxy group in the side chain thereof.

(iii) Further the necessary amount of (meth)acrylic acid is added to react the epoxy group remaining in the reaction mixture of (ii) and the carboxyl group, whereupon the desired prepolymer having the (meth)acryloyl group at the terminal of the side chain is obtained.

Epoxy resins which can be used as the starting material in the present invention are polyaddition homologues of the phenyl glycidyl ether type as prepared from bisphenol (e.g., bisphenol A) and epichlorohydrin. These epoxy resins are represented by formula (IV)

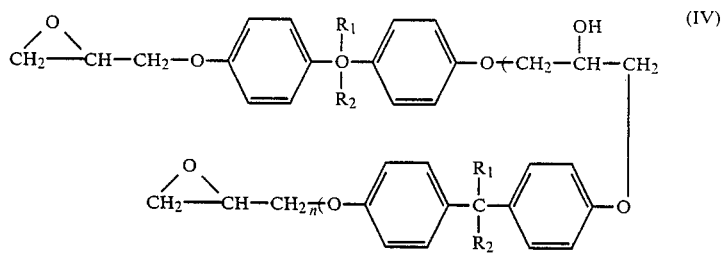

wherein $R_1$, $R_2$ and n are the same as defined above.

Preferred in the present invention are those in which n is 0 to 3.

In connection with the ratio of (meth)acrylic acid to epoxy resin in the preparation of the unsaturated group-containing epoxy resins, the epoxy resin having 2 or more glycidyl-ether type epoxy groups in the molecule thereof is preferably used in an amount of not less than 1 mol per mol of (meth)acrylic acid.

In accordance with another method, a vinyl monomer and (meth)acrylic acid is copolymerized, and then the carboxyl group as the side chain in the copolymer and the epoxy group in the above unsaturated group-containing epoxy resin (A) are subjected to an esterification reaction to obtain the curable prepolymer of the present invention which contains a (meth)acryloyl group in the terminal of the side chain.

A method of preparation of the curable prepolymer represented by formula (II) which is used in the present invention is shown below.

(i) A (meth)acryloyl monomer containing a hydroxyl group is copolymerized with the aforementioned vinyl monomer to form a polymer having a hydroxyl group as the side chain.

(ii) Independently, diisocyanate and monohydric alcohol having a (meth)acryloyl group are reacted in a molar ratio of 1/1 to form an isocyanate containing a free isocyanate group and a (meth)acryloyl group in the molecule.

(iii) The polymer having a hydroxyl group as the side chain as prepared in the step (i) and the (meth)acryloyl group-containing isocyanate as prepared in the step (ii) are reacted in a monomer or solvent.

When the solvent is used, it is necessary to remove it by any suitable method and to make the product as a monomer solution.

Typical examples of (meth)acryloyl monomers having a hydroxyl group used in the step (i) include 2-hydroxyethyl (meth)acrylate, 2-hydroxypropyl (meth)acrylate, 2-hydroxy-3-chloropropyl (meth)acrylate, and methylolacrylamide.

Solution polymerization is advantageously performed in the step (i). The resulting reaction mixture can be subjected to the step (iii) as it is. It is also practical that a polymer obtained by pearl polymerization or bulk polymerization is dissolved in a monomer and subjected to the step (iii).

As the monohydric alcohol having a (meth)acryloyl group used in the step (ii), those of the (meth)acryloyl monomers containing a hydroxyl group described above can be used.

Typical examples of diisocyanates which can be used in the step (ii) include commercially available ones, such as 2,4-tolylene diisocyanate, a mixed isocyanate of 80 wt% of 2,4-tolylene diisocyanate and 20 wt% of 2,6-tolylene diisocyanate, diphenylmethane diisocyanate, hexamethylene diisocyanate, 1,5-naphthylene diisocyanate, isophorone diisocyanate, xylilene diisocyanate, hydrogenated diphenylmethane diisocyanate, hydrogenated xylilene diisocyanate, and 3,3'-dimethyldiphenyl-4,4'-diisocyanate.

The reaction in the step (ii) is carried out by dissolving the diisocyanate in a solvent or monomer and then dropping the unsaturated group-containing monohydric alcohol to the resultant solution.

When a solvent is used, the solvent is usually replaced with a monomer. This is achieved by fractionating the mixture utilizing a difference in boiling point (the solvent has a lower boiling point). In the case of the monomer solution, it can be used as it is.

A method of preparation of the curable prepolymer represented by formula (III) which is used in the present invention is shown below.

The aforementioned vinyl monomer and glycidyl (meth)acrylate are copolymerized. In a subsequent step, (meth)acrylic acid, which is substantially equal molar amounts to an epoxy group in the copolymer, is added to perform the reaction between the epoxy group and the carboxyl group.

In accordance with another method, the aforementioned vinyl monomer and (meth)acrylic acid are copolymerized and, in a subsequent step, glycidyl (meth)acrylate, which is substantially equal molar amounts to a carboxyl group in the copolymer, is added to react the carboxyl group and the epoxy group.

For example, by using as the vinyl monomer a monomer represented by formula (V)

wherein $R_6$ is a hydrogen atom or a methyl group, and $X_3$ is a phenyl group, an alkylphenyl group or a halogenated phenyl group, a curable prepolymer of the general formula (VI) can be obtained:

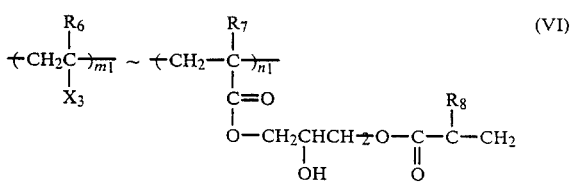

wherein $R_6$ and $X_3$ are the same as defined above, $R_7$ and $R_8$ each represents a hydrogen atom or a methyl group, and $m_1$ and $n_1$ each represents a positive integer.

Copolymerization at the first step can be carried out by solution polymerization, pearl polymerization and so forth. In the case of the solution polymerization, the resultant reaction mixture can be subjected to the subsequent step as it is. On the other hand, in the case of the pearl polymerization, the polymer formed is dissolved in a solvent or monomer and then subjected to the subsequent step.

In copolymerization of the styrene-based monomer and glycidyl monomer, or in copolymerization of the styrenebased monomer and (meth)acrylic acid, the known radical polymerization catalyst, e.g., organic peroxides and azo compounds are used, and the copolymerization can be carried out by choosing a suitable polymerization temperature.

In the present invention, the above copolymerization is not necessary to be carried out to such an extent that the polymerization rate is 100%. For example, it is possible that the copolymerization reaction is stopped at 80% and the reaction mixture containing remaining monomers is subjected to the subsequent step. This is one of the advantages of the present invention.

That is, at the subsequent step, the glycidyl monomer as the unreacted monomer and (meth)acrylic acid are reacted, or (meth)acrylic acid as the unreacted monomer and glycidyl (meth)acrylate are reacted to form a divinyl compound having the di(meth)acryloyl structure represented by the general formula (VII)

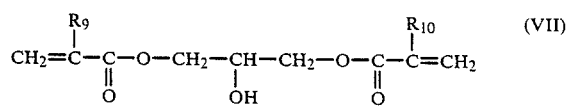

wherein $R_9$ and $R_{10}$ each represents a hydrogen atom or a methyl group. The presence of the divinyl compound does not deteriorate at all the physical properties of the materials after curing of the prepolymer.

It is also apparent that the remaining styrene-based monomer does not exert any adverse influences in the present invention.

In the practice of the reaction at the subsequent step of the present invention, it is preferred that a suitable polymerization inhibitor, e.g., hydroquinone is used in combination in order to prevent the polymerization of the remaining monomer and the crosslinking reaction among copolymers.

In the reaction of the subsequent step, the amount of carboxyl or epoxy group added in the form of (meth)acrylic acid or glycidyl (meth)acrylate is 0.9 to 1.1 equivalents, preferably 0.9 to 1.05 equivalent per equivalent of the epoxy group or carboxyl group contained in the copolymer.

As the crosslinkable vinyl monomer which is used in combination with the curable prepolymer of the present invention, any known vinyl monomers can be used. Examples of the monomer include styrene and substituted styrenes (e.g., α-methylstyrene, p-methylstyrene, and p-chlorostyrene), (meth)acrylic acid esters (e.g., methyl acrylate, ethyl acrylate, butyl acrylate, 2-ethylhexyl acrylate, methyl methacrylate, ethyl methacrylate, butyl methacrylate, lauryl methacrylate, and benzyl methacrylate), vinyl polyfunctional (meth)acrylic acid esters (e.g., ethylene glycol di(meth)acrylate, a polyethylene glycol di(meth)acrylate, 1,4-butanediol di(meth)acrylate, trimethylolpropane tri(meth)acrylate, bisphenol A di(meth)acrylate, a epichlorohydrinmodified bisphenol A di(meth)acrylate, an ethyleneoxidemodified bisphenol A di(meth)acrylate, a propylenemodified bisphenol A di(meth)acrylate, pentaerythritol tri(meth)acrylate, pentaerythritol tetra(meth)acrylate, glycerin di(meth)acrylate, and neopentylglycol di(meth)acrylate), isocyanurates (e.g., diacryloyl isocyanurates, diallyl isocyanurate, and triallyl isocyanurate), and vinyl polyfunctional oligoesters (e.g., polyurethane (meth)acrylate and polyether (meth)acrylate can be used. In addition, dibutyl maleate, dioctyl maleate, phenyl maleimides, vinyl acetate, vinyl propionate, divinylbenzene (e.g., p-vinylstyrene) and its derivatives, diene compounds such as cyclopentadiene and butadiene, divinyl ester compounds, divinyl urethane compounds and so on can be used.

In particular, the aforementioned monofunctional monomers and polyfunctional monomers are preferably used as admixture because heat resistance is increased. It is necessary for the polyfunctional monomers to be capable of copolymerizing with the aforementioned monofunctional monomers. Particularly preferred are polyfunctional monomers which produce a uniform copolymer. The weight ratio of polyfunctional monomer to monofunctional monomer is preferably from 1/20 to ½ and more preferably from 1/10 to 2/5.

The curable prepolymer content of the curable composition of the present invention is usually 10 to 60 wt%. The crosslinkable vinyl monomer is added in an amount of 90 wt% or less. If the amount of the curable prepolymer is less than 10 wt%, the viscosity of the composition is too low, molding properties are deteriorated, the crosslinking density is increased, and the punching properties, heat resistance and solvent resistance of the resulting laminate are deteriorated. On the other hand, if the amount of the curable prepolymer is more than 60 wt%, the viscosity is excessively increased and thus the impregnation properties are decreased.

The term "crosslinkable vinyl monomer" used herein does not include halogen-containing flame retardant monomers set forth below and (meth)acrylic acid.

In some cases, for electric laminates, flame retardance is required, and it is particularly preferred that halogen-containing flame retardant monomers be added to the curable composition of the present invention.

Halogen-containing flame retardant monomers which are preferably used in the present invention include (1) halogen-containing flame retardant monomers obtained by addition reaction of monoglycidyl (meth)acrylate to an ester of saturated polybasic acid and polyhydric alcohol having an aliphatic or alicyclic saturated hydrocarbon group having 1 to 18 carbon atoms and containing a bromine or chlorine atom, (2) brominecontaining flame retardant monomers represented by formula (VIII), and (3) bromine-containing flame retardant monomers represented by formula (IX):

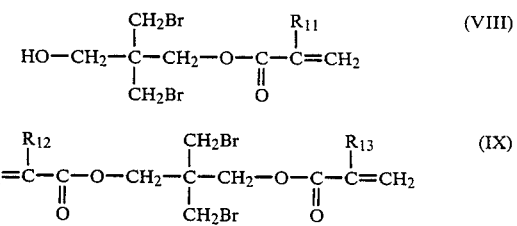

wherein $R_{11}$, $R_{12}$ and $R_{13}$ each represents a hydrogen atom or a methyl group.

Saturated polybasic acids used in the synthesis of the flame retardant monomer (1) are preferably dibasic acids such as oxalic acid, malonic acid, succinic acid, adipic acid, methylglutaric anhydride, pimelic acid, sebacic acid, azelaic acid, phthalic acid, phthalic anhydride, terephthalic acid, isophthalic acid, and tetrachlorophthalic acid.

Polyhydric alcohol used in the synthesis of the flame retardant monomers (1) preferably contain 1 to 10 halogen atoms (Br and/or Cl) and are preferably dihydric aliphatic or alicyclic alcohols having 1 to 12 carbon atoms. Of these alcohols, dibromoneopentyl glycol is easily available, to which the present invention is not limited.

Examples of the flame retardant monomer (1) are represented by formula (X):

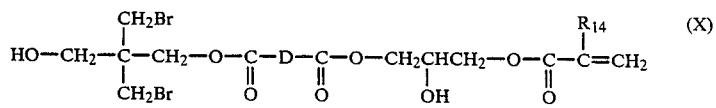

wherein $R_{14}$ is a hydrogen atom or a methyl group, and D represents an aliphatic, alicyclic, or aromatic hydrocarbon group, such as an alkylene group and an arylene group (e.g., a methylene group, an ethylene group, a propylene group, a hexamethylene group, a phenylene group, a methylphenylene group, and a naphthylene group).

The flame retardant monomers (2) and (3) can be prepared by esterifying dibromoneopentyl glycol with (meth)acrylic acid.

When a laminate is produced with paper as a substrate, if the halogen content (calculated as bromine) of the curable composition is not less than about 10%, the resulting laminate exhibits the flame retarding grade of V-0 according to Tests for Flammability of Plastic Materials (UL-94) which is one of Standards of Underwriters Laboratories. It is more effective to use $Sb_2O_3$ in combination.

It is known that aliphatic or alicyclic bromine compounds are not sufficiently thermally stable and, therefore, it is preferable to use them in combination with a stabilizer, e.g., epoxy compounds. On the other hand, it is said that chlorine imparts less flame retardance which is about ½ of that of bromine. As a result of the present inventors' investigations to introduce more stable halogen compounds into the curable composition, it has been found that chlorine-containing flame retardant monomers (4) represented by the following formula (XI) are effectively used in the present invention.

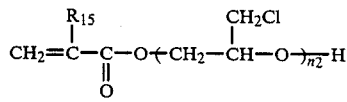

In formula (XI), $R_{15}$ is a hydrogen atom or a methyl group, and n is an integer of 1 to 10 and preferably of 2 to 8.

The above flame retardant monomers (4) can be synthesized, for example, by a method comprising ring-open polymerization of epichlorohydrin in the presence of (meth)acrylic acid by the use of a boron trifluoride/ether complex catalyst. In view of this reaction, $n_2$ is not preferred to be more than 10.

While the monomer (4) imparts less flame retardance than the bromine-containing flame retardant monomers (2) and (3), the monomer (4) is thermally more stable and can be used independently or in combination with the other flame retardant monomers. Particularly preferably the flame retardant monomers (4) are used in combination with the aforementioned flame retardant monomers (2) and/or (3). In the case, the monomer (4) is preferably added in an amount of 50 to 200 wt% based on the total amount of the monomers (2) and/or (3).

The type and amount of the flame retardant monomers (1), (2), (3) and (4) are determined depending on the demand of extent of flame retardance of the composition. The amount of the flame retardant monomer added is preferably from 5 to 70 wt% based on the weight of the curable composition. If the amount of the flame retardant monomer added is less than 5 wt%, an increase in flame retardance cannot be expected. On the other hand, if it is in excess of 70 wt%, physical properties other than flame retardance are undesirably reduced. When the flame retardant monomers are used in combination, the total amount thereof is preferably within the above range.

These flame retardant monomers (1), (2), (3) and (4) have advantages in that since they are not of external additive type but are reactive, they are set in situ in the cured resin, the viscosity of the curable composition is easy to adjust, and the determination of molecular weight of the curable prepolymer represented by formula (I), (II) or (III) and the choice of type of vinyl monomer to be used in the main chain are easy.

In addition, the chlorine-containing flame retardant monomers (4) have another advantage that since they are polyether derivatives, they impart flexibility to the cured resin of the curable composition, thereby increasing its impact resistance.

For the purpose of improving impact resistance, the flexibility-imparting monomers represented by the general formula (XII) may also be added to the curable composition as the crosslinkable vinyl monomer:

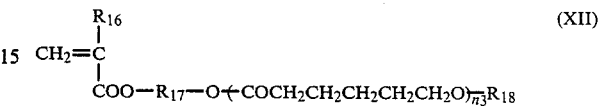

wherein $R_{16}$ is a hydrogen atom or a methyl group, $R_{17}$ is a divalent aliphatic hydrocarbon group having 2 to 5 carbon atoms (preferably 2 to 3 carbon atoms), such as an ethylene group, a propylene group and a butylene group, $R_{18}$ is a hydrogen atom or a hydrocarbon group having 1 to 10 carbon atoms, such as a methyl group, an ethyl group, a propyl group and a butyl group, and $n_3$ is an integer of 1 to 20 and preferably 2 to 10.

These flexibility-imparting monomers are generally prepared by reacting (meth)acrylic acid with ethylene oxide, propylene oxide or tetrahydrofuran, and then addition reacting ε-caprolactone. Representative examples are an ε-caprolactone adduct of hydroxyethyl (meth)acrylate and an ε-caprolactone adduct of hydroxypropyl (meth)acrylate.

The amount of the flexibility-imparting monomer is preferably from 0.1 to 40 wt% based on the total weight of the crosslinkable vinyl monomer which is the one component of the curable composition. If the amount of the flexibility-imparting monomer is less than 0.1%, the effect of improving impact resistance is low. On the other hand, if it is in excess of 40 wt%, a considerable reduction in stiffness occurs.

The curable composition of the present invention can be cured with organic peroxides which are commonly used. In combination with such organic peroxides, or solely, known curing catalysts such as light-sensitive curing catalysts and curing catalysts which are sensitive to radiations and electron rays can be utilized.

To the radical curable composition of the present invention, if necessary, various external additives such as plasticizer, a flame retarder (e.g., antimony trioxide, aluminum hydroxide or like particles), a filler, a stabilizer, a lubricant, an inorganic pigment, a reinforcing agent, a colorant, a releasing agent, a curing agent, and a curing-accelerating agent can be compounded.

The radical curable composition of the present invention can be used in production of laminates for circuits by known methods. That is, a plurality (e.g., 2 to 20 sheets) of sheet-shaped substrates are impregnated with the curable composition of the present invention and then laminated. In the case of metallic foil-covered laminates, an adhesive may be provided on either one side or both sides of the laminate and a metallic foil is superposed thereon. Then, the laminate is cured by heating at 30° to 200° C. (preferably 50° to 150° C.), with or without application of pressure, to produce a laminate for use in production of circuits.

As the sheet shaped substrate of the present invention, substrates used in the conventional laminates can be used. For example, glass fiber-based substrates such as glass fiber cloths and nonwoven fabrics, paper made mainly of cellulose fibers such as kraft paper and linter paper, and inorganic fiber-based substrate such as asbestos, which are shaped in the form of sheet or web, can be used. When paper is used as the sheet-shaped substrate, from viewpoints of impregnation properties and quality, paper made mainly of cellulose fibers such as kraft paper, having a density when air-dried (bulk specific gravity) of 0.3 to 0.7 $g/cm^2$ is preferably used.

The substrate to be used in the present invention is preferably subjected to impregnation and drying treatment using a treating agent such as a silane coupling agent, methylolmelamine, methylolphenol, methylolguanamine and N-methylol compounds, prior to the impregnation with the curable composition, because the water resistance is increased, or water absorbing properties are reduced, leading to improvement in electric characteristics.

While methylolmelamine and methylolguanamine are preferably used when a paper substrate is used, it is particularly preferred that the impregnation and drying treatment of paper support be performed with an agent comprising 20 to 80 wt% of a modified N-methylol compound (component A) and 80 to 20 wt% of an unmodified N-methylol compound (component B), whereby a laminate having well-balanced electric characteristics and impact resistance can be obtained.

Examples of the N-methylol compound for the treating agent comprising the component A and the component B include a melamine-formaldehyde resin a guanamine-formaldehyde resin (e.g., acetoguanamine-formaldehyde resin and benzoguanamine-formaldehyde resin), a area-formaldehyde resin and a cyclic urea resin (e.g., an ethylene-urea-formaldehyde resin and a dihydroxyethylene-urea-formaldehyde resin) can be used. The molar ratio of formaldehyde to be used in the methylolation is 2 to 6 mol, preferably 2 to 3 mol, per mol of melamine in the case of the melamine-formaldehyde resin, and 2 to 4 mol, preferably 2 to 3 mol, per mol of guanamine or urea in the case of the guanamine-formaldehyde resin or the urea based resins.

As modifying agents for use in the modification of the N-methylol compound, compounds having at least one of a hydroxyl group, an epoxy group, an amino group and a carboxyl group which are reactive with the methylol group, and further having an unsaturated group which is reactive with the curable prepolymer having a double bond in the terminal of the side chain are used. Examples include 2-hydroxyethyl (meth)acrylate, glycidyl (meth)acrylate, ethylene glycol monoallyl ether, polyethylene glycol mono(meth)acrylate, polypropylene glycol mono(meth)acrylate, glycerine diallyl ether, and esters of (meth)acrylic acid or an oxy acid and ethylene glycol (e.g.,

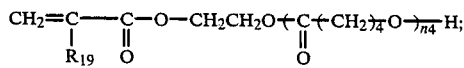

$R_{19} \times H$ or $CH_3$; $n_4 \times 1-5$). These modifying agents are added in an amount of 6 to 15 mol based on the N-methylol compound, and the treatment is carried out at a pH of 2 to 7, a temperature of 50 to 80° C. and a reaction time of 0.5 to 4 hours to obtain the desired modified product. After the completion of the reaction, an excess of the modifying agent is removed by vacuum distillation, and methanol and water are added so that the effective component content is about 60 wt%.

In the paper substrate-treating agent, the solid content of each of the components A and B is 40 to 70 wt%. The proportion of the component A is 20 to 80 wt% (as solids), and that of the component B is 80 to 20 wt% (as solids). The paper substrate is impregnated in the treating agent such that the treating agent is attached in an amount (as solids) of 5 to 40 parts by weight and preferably 10 to 30 parts by weight per 100 parts by weight of the paper substrate.

As the metallic foil for covering, electrolytic copper for use in printing circuits can be used. This copper is preferred from viewpoints of electric conductivity etching properties and adhesion properties. In addition, an electrolytic iron foil and an aluminum foil can be used. Metallic foils having a thickness of 10 to 100 μm are generally used. For the purpose of increasing the adhesion properties, it is more preferred that the adhesion surface of the metallic foil be subjected to coarsening treatment.

In order to effectively achieve the adhesion between the metallic foil and the resin impregnated substrate, it is preferred to use adhesives. As the adhesives, those which are liquid or semi-liquid materials (i.e., viscosity of not more than 5,000 poises and do not produce unnecessary side reaction products in the course of curing are suitable. For example, epoxy-acrylate-based adhesives, epoxy resin-based adhesives, polyisocyanate-based adhesives and their modified adhesives are suitable. As the epoxy-based adhesives, mixtures of bisphenol A-type epoxy resins and amine curing agents such as polyamides and amines are suitable. By using such adhesives, there can be obtained metallic foil covered laminates which are excellent in the adhesion strength of the metallic foil, heat resistance for soldering, and electric insulative characteristics.

When the adhesive is used by coating on the metallic foil, it may be, after coating, subjected to heat treatment at 60 to 150° C. for 2 to 7 minutes to preliminarily cure to such an extent that it is half cured.

The thickness of the adhesive coated is sufficient to be about 10 to 100 μm, with the thickness of 20 to 50 μm being suitable.

It is preferred to add (meth)acrylic acid to the curable composition of the present invention because the adhesion between the laminate and the metallic foil, particularly a copper foil, is increased. Thus there can be obtained a laminate for electric circuits which is free from the phenomenon so-called "land floating" that the land provided in the neighborhood of through-holes of a copper foil laminate for printing circuits is peeled apart from the outer periphery thereof. The amount of (meth)acrylic acid added is usually 0.5 to 20 parts by weight, preferably 3 to 15 parts by weight, per 100 parts by weight of the curable composition. It is possible that a composition with (meth)acrylic acid added is used at contact areas with the copper foil, and at other areas, a composition comprising the curable prepolymer and a crosslinkable vinyl monomer is used.

The thickness of the laminate of the present invention varies with the type of the substrate, the composition of the curable composition, the use of the laminate, and so forth, and it is generally from 0.5 to 3.0 mm. The proportion of the curable resin in the laminate (cured resin/(cured resin + substrate)) is preferably from 30 to 80 wt%.

The present invention is described in greater detail with reference to the following examples although it is not intended to be limited thereto.

The temperature is °C. through the specification, and part and % are by weight unless otherwise indicated.

The curable prepolymer compositions and halogen-containing flame retardant monomer solutions used in the examples are shown below.

Prepolymer Composition I-1

A 3,000-milliliter separable flask equipped with a stirrer, a thermometer with a gas introduction tube, a reflux condenser and a dropping funnel was charged with 30 g (0.41 mol) of methacrylic acid 400 g of methyl ethyl ketone, 800 g (7.7 mol) of styrene, 5.0 g of azobisisobutyronitrile and 12 g of dodecylmercaptan, and polymerization was carried out in a nitrogen atmosphere at 75° to 80° C. for 10 hours. At the end of the time, 0.5 g of hydroquinone was added to terminate the polyxerization. The degree of polymerization of styrene was 76% and that of methacrylic acid was 93%, and a polymer solution containing a styrenemethacrylic acid copolymer having a weight average molecular weight of about 50,000 was obtained.

Separately, 360 g (1 mol) of an epoxy resin ("Epikote 827" (trade name) produced by Yuka-Shell Co., Ltd.), 138 g (1.6 mol) of methacrylic acid, 1.2 g of benzyldimethylamine and 0.12 g of p-benzoquinone were introduced in a reactor different from the above one but having the same constitution, followed by reacting them in a nitrogen atmosphere at 120° C. for 3 hours. The acid value after the reaction was almost 0, and a vinylation agent containing an unsaturated group-containing epoxy resin was obtained.

All the polymer solution as prepared above was added to the vinylation agent, and 5 g of triphenyl phosphine and 0.10 g of p-benzoquinone were added. The resultant mixture was heated to distill away the methyl ethyl ketone solvent at the boiling point of 110° C. and at this temperature, the reaction was performed for 5 hours.

After the reaction, the amount of the unsaturated group-containing epoxy resin was 15% of that before the reaction. While intermittently adding 1,000 g of styrene, heat evaporation was continued at 30 to 50 mmHg. When the methyl ethyl ketone detected in the distillate was less than 0.1%, the operation was stopped. The curable prepolymer-containing resin solution thus obtained was a yellow-brown liquid having an unvolatile content of 52 wt% and a viscosity of 6.2 poises (25° C.).

Prepolymer Composition I-2

In a 5,000-milliliter separable flask equipped with a stirrer, a thermometer with a gas introduction tube, a reflux condenser and a dropping funnel, 35 g (0.41 mol) of methacrylic acid, 600 g (6 mol) of ethyl acrylate, 600 g of methyl ethyl ketone and 6 g of dodecylmercaptan were introduced, and they were heated in a nitrogen atmosphere at 75° C.

A solution of 5 g of azobisisobutyronitrile in 50 ml of methyl ethyl ketone was added through the dropping funnel to lower the inner temperature below 80° C. The reaction was performed at 75° to 80° C. for 8 hours. Then the temperature was raised to 180° C. to distill away the methyl ethyl ketone and a small amount of unreacted ethyl acrylate. There was obtained 631 g of a polymer having a weight average molecular weight of 70,000.

In another reactor (2,000 ml) having the same constitution as above, 360 g (1 mol) of Epikote 827 (trade name), 138 g (1.6 mol) of methacrylic acid, 1.2 g of benzyldimethylamine, and 0.12 g of parabenzoquinone was introduced, and the reaction was performed in a nitrogen atmosphere at 120° C. for 3 hours.

The acid value after the reaction was almost 0, and there was obtained a vinylation agent containing an unsaturated group-containing epoxy resin.

Then, 1,000 g of styrene was added to and dissolved in the above vinylation agent, and introduced in the flask containing the polymer prepared above. In addition, 5 g of triphenylphosphine and 0.10 g of parabenzoquinone were added and heated, and the reaction was performed at 120° C. for 4 hours. After the reaction, the amount of the unsaturated group-containing epoxy resin was about 13% of that before the reaction.

The curable prepolymer-containing resin solution thus obtained was a yellow-brown liquid having an unvolatile content of 53 wt% and a viscosity of 8.9 poises (25° C).

Prepolymer Composition II-1

In a 5,000-milliliter separable flask equipped with a stirrer, a thermometer, a cooling tube and a dropping funnel, 2,309 g of styrene, 177 g of 2-hydroxyethyl methacrylate, 5.0 g of tert-dodecylmercaptan and 2.5 g of n-dodecylmercaptan were introduced, and they were reacted in a nitrogen atmosphere at 120° C. for 6 hours. During the reaction, n-dodecylmercaptan was added three times to the reaction solution in a total amount of 15 g. The conversion of styrene was 60% after the reaction. Then, 894 g of styrene was further added thereto to obtain reaction solution (A).

Separately, in a 1,000-milliliter separable flask equipped with a stirrer, a thermometer, a cooling tube and a dropping funnel were introduced 235 g of 2,4-tolylenediisocyanate and 192 g of styrene, followed by dropwise adding thereto 235 g of 2-hydroxypropyl methacrylate at 50° to 60° C. Then, the reaction was performed at 60° C. for 2 hours. After adding 0.6 g of dibutyl tin dilaurate to the reaction solution, the reaction was further continued for 2 hours at 60° C. Then 0.01 g of phenothiazine was added thereto to obtain reaction solution (B).

All amount of reaction solution (B) was added to all amount of reaction solution (A), to which 12 g of dibutyl tin dilaurate was then added. After performing the reaction at 70° C. for 1 hour, 0.2 g of phenothiazine was added thereto to obtain a curable prepolymer-containing resin solution which was a light yellow clear liquid having a viscosity of 6.5 poises (25° C.).

The curable prepolymer had a molecular weight of about 40,000 and had a main chain made of styrene and 2-hydroxyethyl methacrylate (weight ratio = 82%) and an unsaturated group-containing side chain made of 2-hydroxypropyl methacrylate and tolylene diisocyanate (weight ratio = 8%). The resin solution contained 12 wt% of unreacted components.

Prepolymer Composition III-1

In a 5,000-milliliter separable flask equipped with a stirrer, a cooling tube, a dropping funnel and a thermometer, 72 g (1 mol) of acrylic acid, 800 g (8 mol) of ethyl acrylate, 53 g (1 mol) of acrylonitrile, 700 g of methyl ethyl ketone and 10 g of dodecylmercaptan were introduced and they were heated in a nitrogen atmosphere to 75° C.

A solution of 5 g of azobisisobutyronitrile in 50 g of methyl ethyl ketone was dropped through the dropping funnel over about 1 hour while maintaining the temperature in the reactor at 75° to 80° C. After the completion of addition of the catalyst, the reaction was continued for 8 hours at the same temperature.

The inside of the reactor was heated to 180° C. to distill away small amounts of unreacted monomers and methyl ethyl ketone.

The amount of the polymer formed in the reactor (flask) was 920 g, and the weight average molecular weight of the polymer was 40,000.

In the reactor, 142 g (1 mol) of glycidyl methacrylate, and 1,000 g of styrene were introduced, and 0.2 g of p-benzoquinone and 4 g of triphenylphosphine were added. Then the reaction was performed at 110° C. for 5 hours. The degree of esterification of glycicyl methacrylate was about 88%. The radical curable prepolymer-containing resin solution thus obtained was a yellow brown liquid having an unvolatile content of 53% and a viscosity of 7.1 poises (25° C).

Prepolymer Composition III-2

In a 1,000-milliliter separable flask equipped with a stirrer, a thermometer, a reflux condenser, a gas introduction tube and a dropping funnel, 300 g of styrene, 45.4 g of glycidyl methacrylate, 3.5 g of benzoyl peroxide and 3.5 g of n-dodecylmercaptan were introduced. While blowing nitrogen, a mixture of 133 g of styrene, 45.4 of glycidyl methacrylate, 1.8 g of benzoyl peroxide and 1.8 g of n-dodecylmercaptan was dropped at 115° C. over 2 hours, and the reaction was further performed at 115° C. for 1.5 hours. As a result, the conversion of styrene was 48% and the conversion of glycidyl methacrylate was 76%, and there was obtained a colorless clear resin solution.

To this solution were added 49.0 g of acrylic acid and 0.5 g of hydroquinone, which were then reacted at 100° C. for 4 hours. The conversion of acrylic acid was 90%, and a light yellow, clear resin solution was obtained.

Prepolymer Composition III-3

In a 1,000-milliliter flask equipped with a stirrer, a thermometer with a gas introduction tube, a reflux condenser and a dropping funnel were introduced 199 g of methyl ethyl ketone as a solvent, and then 52.0 g (0.5 mol) of styrene, 14.2 g (0.1 mol) of glycidyl methacrylate, 0.52 g of benzoyl peroxide and 0.52 g of dodecylmercaptan. While blowing nitrogen, the reaction was performed at 85 to 90° C. for 5 hours. The degree of polymerization of styrene was 62%, and the degree of polymerization of glycidyl methacrylate was 73%. The solvent and unreacted monomers were removed by the use of a rotary evaporator to obtain a white polymer.

In the same equipment as above, a 45% styrene solution of all the above copolymer was introduced, and then 6.4 g of methacrylic acid and 0.04 g of hydroquinone were introduced. The reaction was performed at 100° C. for 5 hours. The degree of methacrylic acid was 94%.

The resin solution was light yellow in color and had a viscosity of 5.6 poises at 25° C.

To 100 parts of the above resin solution were added 1 part of a peroxide catalyst ("Percure SA" (trade name), produced by Nippon Oil & Fats Co., Ltd.) and 0.5 part of cobalt naphthenate (6% Co), and the ordinary temperature gelling test was performed. The gelling time was 13 minutes, the shortest curing time was 15.3 minutes, and the maximum heat generated temperature was 149° C.

The cured resin had the following physical properties and was excellent in transparency.

| | |
|---|---|
| Tensile strength: | 6.5 kg/mm$^2$ |
| Flexual strength: | 12.8 kg/mm$^2$ |
| Coefficient of bending modulus: | 314 kg/mm$^2$ |
| Heat distortion temperature: | 120° C. |

Prepolymer Composition III-4

In the same equipment as used in the preparation of Prepolymer Composition III-2, 199 g of methyl ethyl ketone as a solvent was introduced, and then 52.0 g (0.5 mol) of styrene, 17.2 g (0.2 mol) of methacrylic acid, 0.52 g of benzoyl peroxide, and 0.52 g of dodecylmercaptan were introduced. While blowing nitrogen, the reaction was performed at 105° to 110° C. for 4 hours. The degree of polymerization of styrene was 65%, and the degree of polymerization of methacrylic acid was 68%. Styrene was further added, and only the methyl ethyl ketone was removed by the use of a rotary evaporator to obtain a copolymer resin composition (copolymer content: 45%).

In the same equipment as above, the above copolymer resin composition was introduced, and then 28.4 g (0.2 mol) of glycidyl methacrylate and 0.05 g of hydroquinone was added. The reaction was performed at 110° to 120° C. for 3 hours, and the conversion of glycidyl methacrylate was 88%.

Unsaturated Polyester Resin Composition (I) (Comparative Resin)

In a 1,000-milliliter separable flask equipped with a stirrer, a thermometer, a gas introduction tube and a cooler, 100 g of propylene glycol and 83.2 g of isophthalic acid were introduced, and they were reacted at 185° C. for 3 hours while distilling off condensed water and blowing nitrogen. Then 87.2 g of fumaric acid was added and reacted at 185° C. for 6 hours. Finally the system was reduced to about 10 mmHg in pressure, and the temperature of the flask was raised to 200° C. to complete the reaction. A resin having an acid value of 30 was obtained. This resin was dissolved in styrene to obtain an unsaturated polyester resin composition (I) having a styrene concentration of 40%.

Flame Retardant Monomer Solution (a)

In a 1,000-milliliter separable flask equipped with a dropping funnel and a stirrer, 360 g (1.37 mol) of dibromoneopentyl glycol was introduced, and it was then melted. Then 185 g (1.25 mol) of phthalic anhydride and 1.0 g of p-toluenesulfonic acid were added thereto. The reaction was performed at 170° C. for 4 hours under a reduced pressure of 20 to 200 mmHg. As a result, the acid value of the product became 40. Then 140 g of styrene, 54 g (0.38 mol) of glycidyl methacrylate, 0.12 g of hydroquinone and 1.2 g of triethylamine were added and reacted at 80° C for 4 hours. The conversion of glycidyl methacrylate was 95%, and a flame retardant monomer solution having an acid value of 9 was obtained.

Flame Retardant Monomer Solution (b)

In a 500-milliliter separable flask equipped with a stirrer, 262 g (1 mol) of dibromoneopentyl glycol, 108 g (1.5 mol) of acrylic acid, 2.6 g of sulfuric acid and 0.05 g of p-benzoquinone were heated with stirring, and air was flown at a rate of about 20 Nl/hr. Water resulting from esterification was discharged along with an air flow accompanied by a small amount of acrylic acid. After 6 hours, an aqueous slurry containing 6 g of barium carbonate was added and the operation was continued until water was not distilled, whereby a dibromoneopentyl glycol acrylic acid ester mixture was obtained.

Flame Retardant Monomer Solution (c)

In a 1,000-milliliter flask equipped with a stirrer, 72 g (1 mol) of acrylic acid and 3 g of a $BF_3 \cdot$ether catalyst were introduced, and while dropping 463 g (5 mol) of epichlorohydrin, the reaction was performed while maintaining the temperature at not more than 50° C. The reaction was completed in 6 hours. The reaction mixture was neutralized with aqueous ammonia, and an aqueous layer was separated by the use of a separating funnel. Then anhydrous sodium sulfate was added to achieve dehydration.

Excessive sodium sulfate and hydrated sodium sulfate were removed by filtration.

The filtrate at 30° C. was charged in a flat plate at a depth of 1 cm under pressure reduced to 1 mmHg to remove volatile components.

EXAMPLES 1 to 4

A 10 cm x 10 cm kraft paper having a basis weight of 135 g/m² was dipped in an aqueous solution of methylolmelamine ("Nikaresin S-305 (trade name) produced by Nippon Carbide, Co., Ltd.), squeezed with rollers, and dried at 120° C. for 30 minutes.

In the paper substrate thus obtained, 11.4wt% of methylolmelamine was developed. This paper was placed in a flat plate, and impregnated with a resin composition having the formulation shown in Table 1 by floating it on the resin composition.

Six sheets of the papers containing the resin composition and one sheet of a commercially available phenol type adhesive-provided copper foil ("MK-56" (trade name) produced by Mitsui Kinzoku Kogyo Co., Ltd.) were superposed, placed in a cellophane bag, sandwiched between two iron plates, and a weight of 30 kg was placed thereon.

In this state, the above assembly was placed in an air oven maintained at 120° C. for 1 hour and further at 100° C. for 10 hours.

The laminate thus obtained had a thickness of 1.59 to 1.61 mm. Characteristic values of the laminate are shown in Table 2.

TABLE 1

| Compounding Component | Ex. 1 | Ex. 2 | Ex. 3 | Ex. 4 |
|---|---|---|---|---|
| Prepolymer Composition I-1 | 100 | — | — | — |
| Prepolymer Composition I-2 | — | 100 | — | — |
| Prepolymer Composition II-1 | — | — | 60 | 50 |
| Styrene Monomer | — | — | 40 | 30 |
| Ethyl Acrylate | — | — | — | 20 |
| Tert-butylperoxy Benzoate | 1.5 | 1.5 | 1.5 | 1.5 |

TABLE 2

Physical Properties of Laminate

| Characteristic Value | Ex. 1 | Ex. 2 | Ex. 3 | Ex. 4 |
|---|---|---|---|---|
| Dielectric Constant (1 MHz) (JIS C 6481) | 3.5 | 3.9 | 3.2 | 3.6 |
| Dielectric Loss (1 MHz) (JIS C 6481) | 0.028 | 0.033 | 0.024 | 0.026 |
| Insulation Resistance (JIS C 6481) ($\times 10^{15} \Omega$) | 3.8 | 3.1 | 3.9 | 3.1 |
| Surface Resistance (JIS C 6481) ($\times 10^{14} \Omega$) | 5.4 | 3.3 | 6.4 | 7.7 |
| Comparison Tracking Index (IEC method) (V+) | 600 | 600 | 600 | 600 |
| Rate of Water Absorption (E-24/50 + D-24/23) (%) | 0.61 | 0.73 | 0.51 | 0.62 |
| Solder Heat Resistance (260° C.) | | | | |
| (C-96/23/65) (sec) | 60< | 60< | 60< | 60< |
| (C-96/40/95) (sec) | 13 | 16 | 14 | 13 |
| Peel Strength (C-96/23/65) (kg/cm) | 1.5 | 1.5 | 1.3 | 1.6 |
| Punching Properties* (°C.) | 80< | 50< | 80< | 50< |

*Temperature at which no fault (crack, peeling, etc.) is produced in the laminate where 4 holes (diameter 1 mm) are provided rectilinearly at the distance of 1.78 mm between the centers of the holes.

EXAMPLE 5

In a 5,000-milliliter separable flask equipped with a stirrer, a thermometer with a gas introduction tube, a reflux condenser and a dropping funnel, 1,300 g of methyl ethyl ketone as a solvent was introduced, and then 312 g (3 mol) of styrene, 103.2 g (1.2 mol) of methacrylic acid, 3 g of benzoyl peroxide and 3.5 g of dodecylmercaptan were introduced. They were reacted at 110° to 120° C. for 5 hours while blowing nitrogen. The degree of polymerization of styrene was 78%, and that of methacrylic acid was 83%. The solvent and unreacted monomers were removed by the use of a rotary evaporator to obtain a white polymer.

In the same equipment as above, a 55% styrene solution of the above polymer was introduced, and then 142 g (1 mol) of glycidyl methacrylate and 0.3 g of hydroquinone were added. They were reacted at 105° to 110° C. for 3 hours. The conversion of glycidyl methacrylate was 89%.

This resin solution was light yellow and the viscosity was 5.8 poises.

To 100 parts of the above resin solution were added 15 parts by weight of divinylbenzene, 1 part of "Percure SA" (trade name) and 0.3 part of 6% cobalt naphthenate. A commercially available kraft paper having a basis weight of about 135g/ m² was impregnated with the above mixture from one side thereof. Six resin-impregnated papers were superposed, and then copper foils were laminated on both sides. The resultant laminate was maintained at 80° C. for 30 minutes, and raised in temperature to 100° C. and maintained at 100° C. for 30 minutes to thereby obtain a copper-covered laminate having a thickness of 1.6 mm. Then, after-curing was performed at 100° C. for 8 hours.

This copper-covered laminate was dipped in a solder bath maintained at 260° C. for 1 minute and then pulled out. The laminate still held the hardness as a plate.

EXAMPLES 6 to 24

A kraft paper (10 cm×10 cm) having a basis weight of about of 135 g/m² was dipped in an aqueous solution of methylolmelamine ("Nikaresin S-305": trade name), squeezed with rolls, and dried at 120° C. for 30 minutes. In the paper substrate thus obtained, 11.4 wt% of methylolmelamine was developed. This paper was placed in a flat plate, and impregnated with a resin composition liquid having the formulation shown in Table 3 by floating on the resin composition liquid.

Six resin composition-containing papers and one commercially adhesive-provided copper foil "MK-56" (trade name) were superposed, placed in a cellophane bag, sandwiched between two iron plates, and a weight of 30 kg was placed thereon.

In this state, the laminate was placed in an air oven maintained at 120° C., and cured at 120° C. for 1 hour and further at 100° C. for 10 hours.

The laminate thus obtained had a thickness of 1.59 to 1.61 mm. Characteristic values of the laminate are shown in Table 4.

TABLE 3

Formulation of Resin Composition (parts)

| Compounding Component | Example 6 | 7 | 8 | 9 | 10 | 11 |
|---|---|---|---|---|---|---|
| Prepolymer Composition I-1 | 52 | — | — | — | — | — |
| Prepolymer Composition I-2 | — | 50 | — | — | — | — |
| Prepolymer Composition II-1 | — | — | 34 | 33 | — | — |
| Prepolymer Composition III-1 | — | — | — | — | 44 | 42 |
| Flame Retardant Monomer Solution (a) | 37 | 39 | 31 | 30 | 41 | 41 |
| Styrene | 10 | 10 | 33 | 10 | 13 | 8 |
| Ethyl Acrylate | — | — | — | 25 | — | 7 |
| Epikote 827 (trade name) | 1 | 1 | 2 | 2 | 2 | 2 |
| Tert-butylperoxy Benzoate | 1.5 | 1.5 | 1.5 | 1.5 | 1.5 | 1.5 |
| Sb₂O₃ | 3 | 3 | 3 | 3 | 3 | 3 |

| Compounding Component | Example 12 | 13 | 14 | 15 | 16 | 17 |
|---|---|---|---|---|---|---|
| Prepolymer Composition I-1 | 63 | — | — | — | — | — |
| Prepolymer Composition I-2 | — | 68 | — | — | — | — |
| Prepolymer Composition II-1 | — | — | 36 | 36 | — | — |
| Prepolymer Composition III-1 | — | — | — | — | 60 | 72 |
| Flame Retardant Monomer Solution (b) | 26 | 26 | 28 | 28 | 26 | 28 |
| Styrene | 11 | 6 | 22 | 36 | 14 | — |
| Ethyl Acrylate | — | — | 14 | — | — | — |
| Epikote 827 (trade name) | — | 1 | — | 1 | — | 2 |
| Tert-butylperoxy Benzoate | 1.5 | 1.5 | 1.5 | 1.5 | 1.5 | 1.5 |
| Sb₂O₃ | 3 | 3 | 3 | — | 3 | — |

| Compounding Component | Example 18 | 19 | 20 | 21 | 22 | 23 | 24 |
|---|---|---|---|---|---|---|---|
| Prepolymer Composition I-1 | 54 | 49 | 44 | — | — | — | — |
| Prepolymer Composition II-1 | — | — | — | 21 | 23 | — | — |
| Prepolymer Composition III-1 | — | — | — | — | — | 52 | 39 |
| Flame Retardant Monomer Solution (b) | 25 | 22 | 20 | 25 | 22 | 27 | 25 |
| Flame Retardant Monomer Solution (c) | 15 | 20 | 25 | 15 | 20 | 10 | 15 |
| Styrene | 5 | 8 | 10 | 39 | 35 | 10 | 20 |
| Epikote 827 (trade name) | 1 | 1 | 1 | — | 1 | 1 | 1 |
| Tert-butylperoxy Benzoate | 1.5 | 1.5 | 1.5 | 1.5 | 1.5 | 1.5 | 1.5 |
| Sb₂O₃ | 3 | 3 | 3 | 3 | — | 3 | 3 |

TABLE 4

Characteristics of Laminate

| Characteristic Value | Example 6 | 7 | 8 | 9 | 10 | 11 | 12 | 13 | 14 |
|---|---|---|---|---|---|---|---|---|---|
| Rate of Water Absorption (E-24/50 + D-24/23) (%) | 0.55 | 0.58 | 0.51 | 0.65 | 0.54 | 0.60 | 0.41 | 0.55 | 0.78 |
| Inflammability (UL-94) | V-O | V-O | V-O | V-O | V-O | V-O | V-O | V-O | V-O |
| Solder Heat Resistance (260° C.) | | | | | | | | | |
| (C-96/23/65) (sec) | 60< | 60< | 55 | 60< | 60< | 20 | 57 | 63 | 41 |
| (C-96/40/95) (sec) | 21 | 25 | 20 | 21 | 22 | 20 | 14 | 18 | 14 |
| Punching Properties* (°C.) | 50< | 50< | 60< | 50< | 50< | 50< | 80< | 50< | 70< |
| Peel Strength (C-96/23/65) (kg/cm) | 1.3 | 1.5 | 1.2 | 1.4 | 1.3 | 1.1 | 1.6 | 1.5 | 1.4 |

| Characteristic Value | Example 15 | 16 | 17 | 18 | 19 | 20 | 21 | 22 | 23 | 24 |
|---|---|---|---|---|---|---|---|---|---|---|
| Rate of Water Absorption (E-24/50 + D-24/23) (%) | 0.43 | 0.58 | 0.65 | 0.49 | 0.53 | 0.62 | 0.51 | 0.62 | 0.72 | 0.60 |
| Inflammability (UL-94) | V-O | V-O | V-O | V-O | V-O | V-O | V-O | V-O | V-O | V-O |
| Solder Heat Resistance (260° C.) | | | | | | | | | | |
| (C-96/23/65) (sec) | 37 | 60< | 60< | 60< | 60< | 60< | 60< | 60< | 60< | 60< |
| (C-96/40/95) (sec) | 13 | 14 | 18 | 16 | 15 | 17 | 14 | 13 | 15 | 18 |
| Punching Properties* (°C.) | 80< | 50< | 40< | 55< | 40< | 30< | 50< | 40< | 30< | 40< |
| Peel Strength (C-96/23/65) (kg/cm) | 1.1 | 1.4 | 1.7 | 1.7 | 1.4 | 1.5 | 1.3 | 1.5 | 1.3 | 1.5 |

EXAMPLE 25

Production of Laminate 75 parts of Prepolymer Composition III-2, 25 parts of 2,3-dibromopropyl maleate, 4 parts of antimony trioxide, 1 part of an organic peroxide catalyst ("Perhexa 3M" (trade name) produced by Nippon Oil & Fats Co., Ltd.) and 5 parts of an ε-caprolactone (8 mol) adduct of hydroxyethyl methacrylate were thoroughly mixed to obtain a radical curable resin composition. Five methylolmelamine treated paper substrates were impregnated with the above resin composition, laminated on each other, and cured by heating under a pressure of 0.1 kg/cm²G at 100° C. for 15 minutes and further at 160° C. for 10 minutes to obtain a laminate having a thickness of 1.60 mm.

Properties of the curable resin composition and physical properties of the laminate are shown in Table 5.

For comparison, a curable resin composition and a laminate were produced in the same manner as above except that 75 parts of the above unsaturated polyester resin composition (I) was used in place of 75 parts of Prepolymer Composition III-2. Properties of the curable resin composition and physical properties of the laminate are shown in Table 5.

TABLE 5

|  | Example of Present Invention | Comparative Example |
| --- | --- | --- |
| Composition: |  |  |
| Styrene content (%) | 26.3 | 27.3 |
| ε-Caprolactone adduct of hydroxyethyl-methacrylate (%) | 4.5 | 4.5 |
| Viscosity (25° C.) (poises) | 8.5 | 8.2 |
| Laminate: |  |  |
| Dropping ball impact strength (23° C.) (cm) | 27.0 | 18.0 |
| Modulus in flexure (100° C.) (kg/mm$^2$) | 270 | 280 |

It can be seen from the results of Table 5 that in the composition and laminate of the present invention, impact strength is increased and there is almost no decrease in stiffness.

Using Prepolymer Composition III-3 or III-4, a laminate was produced in the same manner as above. Like the laminate using Prepolymer Composition III-2, the resultant laminate exhibited excellent impact resistance and stiffness.

EXAMPLES 26 to 28

A kraft paper (10 cm × 10 cm) having a basis weight of about of 135 g/m$^2$ was dipped in an aqueous solution of methylolmelamine ("Nikaresin S-305": trade name), squeezed with rolls, and dried at 120° C. for 30 minutes. In the paper substrate thus obtained, 12.5 wt% of methylolmelamine was developed. This paper was placed in a flat plate, and impregnated with a resin composition liquid having the formulation shown in Table 6 by floating on the resin composition liquid.

A copper foil "MK-56" (trade name) was coated with an adhesive composition consisting of 70 parts of an epoxy resin ("Epikote 827; trade name), 20 parts of a polyamide resin (dimer acid-based polyamideamine) and 10 parts of polybutadiene nitrile rubber (terminal amino group-containing polybutadiene nitrile rubber oligomer; acrylonitrile copolymerization ratio 17%) to form an adhesive layer of 50 μm in thickness. The coated copper foil was then heated at 100° C. for 6 minutes.

Six resin composition-containing papers and the above adhesive-provided copper foil were superposed, placed in a cellophane bag, sandwiched between two iron plates, and a weight of 30 kg was placed thereon.

In this state, the laminate was placed in an air oven maintained at 120° C., and cured at 120° C. for 1 hour and further at 100° C. for 10 hours.

The laminate thus obtained had a thickness of 1.59 to 1.61 mm. Characteristic values of the laminate are shown in Table 7.

TABLE 6

Formulation of Resin Composition (parts)

| Compounding Component | Example 26 | Example 27 | Example 28 |
| --- | --- | --- | --- |
| Prepolymer Composition I-1 | 63 | — | — |
| Prepolymer Composition II-1 | — | 36 | — |
| Prepolymer Composition III-2 | — | — | 60 |
| Flame Retardant Monomer Solution (b) | 27 | 28 | 26 |
| Styrene | 11 | 37 | 15 |
| Epikote 827 (trade name) | — | 1 | — |
| Tert-butylperoxy Benzoate | 1.5 | 1.5 | 1.5 |
| Sb$_2$O$_3$ | 3 | 3 | 3 |

TABLE 7

Characteristics of Laminate

| Characteristic Value | Example 26 | Example 27 | Example 28 |
| --- | --- | --- | --- |
| Rate of Water Absorption (E-24/50 + D-24/23) (%) | 0.43 | 0.41 | 0.53 |
| Inflammability (UL-94) | V-O | V-O | V-O |
| Solder Heat Resistance (260° C.) |  |  |  |
| (C-96/23/65) (sec) | 60< | 42 | 60< |
| (C-96/40/95) (sec) | 19 | 18 | 19 |
| Punching Properties* (°C.) | 80< | 80< | 50< |
| Peel Strength (C-96/23/65) (kg/cm) | 1.8 | 1.9 | 2.0 |

*See Table 2.

While the invention has been described in detail and with reference to specific embodiments thereof, it will be apparent to one skilled in the art that various changes and modifications can be made therein without departing from the spirit and scope thereof.

What is claimed is:

1. A laminate comprising fibrous substrates which are impregnated with a curable composition, laminated and cured, the curable composition comprising,
   (i) a curable prepolymer having a main chain consisting essentially of a random copolymer of a vinyl monomer and an acrylic or methacrylic monomer, and a side chain containing an acryloyl or methacryloyl group at the terminal, as a main component, and
   (ii) a crosslinkable vinyl monomer.

2. The laminate as claimed in claim 1, wherein the curable prepolymer is represented by formula (I)

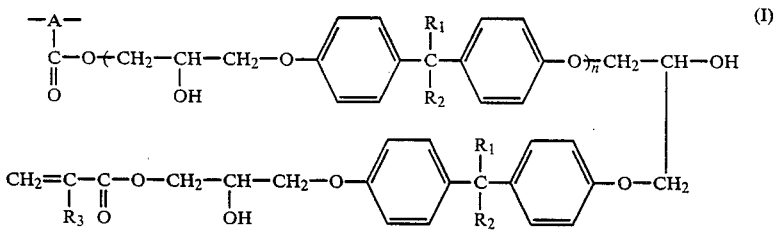

(I)

wherein A represents a main chain made of a random copolymer of vinyl monomer and an acryloyl or methacryloyl monomer, $R_1$ to $R_3$ each represents a hydrogen atom or a methyl group, and n is 0 or an integer of 1 to 5.

3. The laminate as claimed in claim 1, wherein the curable prepolymer is represented by formula (II)

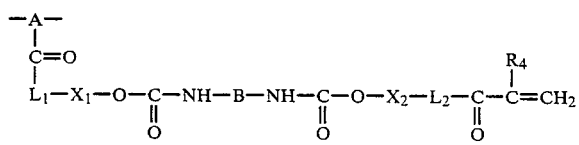

(II)

wherein A represents a main chain made of a random copolymer of vinyl monomer and an acryloyl or methacryloyl monomer, $X_1$ and $X_2$ each represents a hydrocarbon group having 1 to 16 carbon atoms or a hydrocarbon group linked through an ether bond and having 1 to 16 carbon atoms in total, B represents an aliphatic, alicyclic or aromatic hydrocarbon group having up to 20 carbon atoms, $L_1$ and $L_2$ each represents —O— or —NH—, and $R_4$ is a hydrogen atom or a methyl group.

4. The laminate as claimed in claim 1, wherein the curable prepolymer is represented by formula (III)

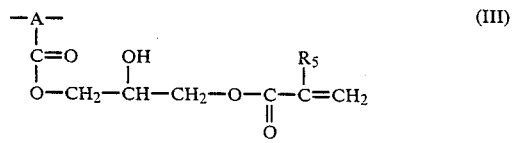

(III)

wherein A represents a main chain made of a random copolymer of vinyl monomer and an acryloyl or methacryloyl monomer, and $R_5$ represents a hydrogen atom or a methyl group.

5. The laminate as claimed in claim 1, wherein the proportion of the curable prepolymer in the curable composition is 10 to 60 wt%.

6. The laminate as claimed in claim 2, wherein the proportion of the curable prepolymer in the curable composition is 10 to 60 wt%.

7. The laminate as claimed in claim 3, wherein the proportion of the curable prepolymer in the curable composition is 10 to 60 wt%.

8. The laminate as claimed in claim 4, wherein the proportion of the curable prepolymer in the curable composition is 10 to 60 wt%.

9. The laminate as claimed in claim 5, wherein the crosslinkable vinyl monomer is a mixture of a monofunctional monomer and a polyfunctional monomer, and the weight ratio of polyfunctional monomer to monofunctional monomer is 1/20 to ½.

10. The laminate as claimed in claim 6, wherein the crosslinkable vinyl monomer is a mixture of a monofunctional monomer and a polyfunctional monomer, and the weight ratio of polyfunctional monomer to monofunctional monomer is 1/20 to ½.

11. The laminate as claimed in claim 7, wherein the crosslinkable vinyl monomer is a mixture of a monofunctional monomer and a polyfunctional monomer, and the weight ratio of polyfunctional monomer to monofunctional monomer is 1/20 to ½.

12. The laminate as claimed in claim 8, wherein the crosslinkable vinyl monomer is a mixture of a monofunctional monomer and a polyfunctional monomer, and the weight ratio of polyfunctional monomer to monofunctional monomer is 1/20 to ½.

13. The laminate as claimed in claim 5, wherein the curable composition further contains 5 to 70 wt% of a halogen-containing flame retardant monomer selected from the group consisting of (i) halogen-containing flame retardant monomers resulting from the addition reaction of monoglycidyl methacrylate of monoglycidyl acrylate to an ester of a saturated polybasic acid and a polyhydric alcohol having a bromine or chlorine-containing aliphatic or alicyclic saturated hydrocarbon group having 1 to 18 carbon atoms, (ii) bromine-containing flame retardant monomers represented by formulae (VIII) and (IX), and (iii) chlorine-containing flame retardant monomers represented by formula (XI):

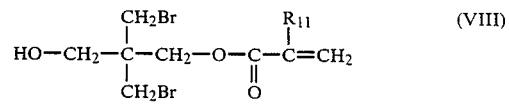

(VIII)

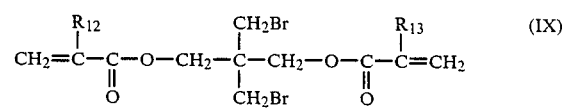

(IX)

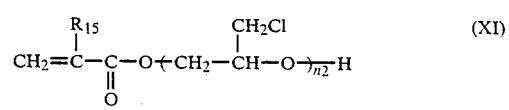

(XI)

wherein $R_{11}$, $R_{12}$, $R_{13}$ and $R_{15}$ each represents a hydrogen atom or a methyl group, and $n_2$ is an integer of 1 to 10.

14. The laminate as claimed in claim 6, wherein the curable composition further contains 5 to 70 wt% of a halogen-containing flame retardant monomer selected from the group consisting of (i) halogen-containing flame retardant monomers resulting from the addition reaction of monoglycidyl methacrylate or monoglycidyl acrylate to an ester of a saturated polybasic acid and a polyhydric alcohol having a bromine or chlorine-containing aliphatic or alicyclic saturated hydrocarbon group having 1 to 18 carbon atoms, (ii) bromine-containing flame retardant monomers represented by formulae (VIII) and (IX), and (iii) chlorine-containing flame retardant monomers represented by formula (XI):

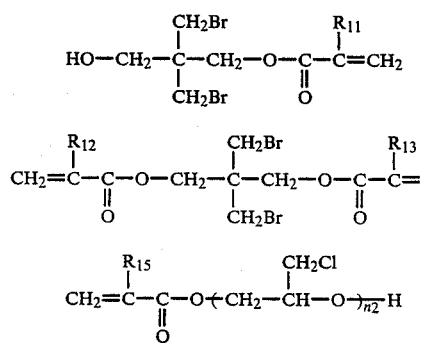

wherein $R_{11}$, $R_{12}$, $R_{13}$ and $R_{15}$ each represents a hydrogen atom or a methyl group, and $n_2$ is an integer of 1 to 10.

15. The laminate as claimed in claim 7, wherein the curable composition further contains 5 to 70 wt% of a halogen-containing flame retardant monomer selected from the group consisting of (i) halogen-containing flame retardant monomers resulting from the addition reaction of monoglycidyl methacrylate or monoglycidyl acrylate to an ester of a saturated polybasic acid and a polyhydric alcohol having a bromine or chlorine-containing aliphatic or alicyclic saturated hydrocarbon group having 1 to 18 carbon atoms, (ii) bromine-containing flame retardant monomers represented by formulae (VIII) and (IX), and (iii) chlorine-containing flame retardant monomers represented by formula (XI):

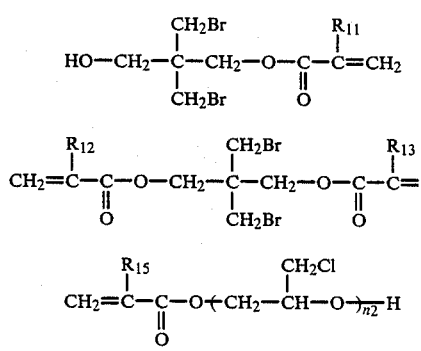

wherein $R_{11}$, $R_{12}$, $R_{13}$ and $R_{15}$ each represents a hydrogen atom or a methyl group, and $n_2$ is an integer of 1 to 10.

16. The laminate as claimed in claim 8, wherein the curable composition further contains 5 to 70 wt% of a halogen-containing flame retardant monomer selected from the group consisting of (i) halogen-containing flame retardant monomers resulting from the addition reaction of monoglycidyl methacrylate or monoglycidyl acrylate to an ester of a saturated polybasic acid and a polyhydric alcohol having a bromine or chlorine-containing aliphatic or alicyclic saturated hydrocarbon group having 1 to 18 carbon atoms, (ii) bromine-containing flame retardant monomers represented by formulae (VIII) and (IX), and (iii) chlorine-containing flame retardant monomers represented by formula (XI):

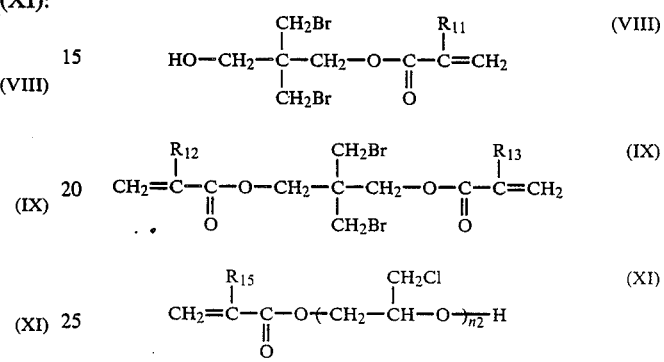

wherein $R_{11}$, $R_{12}$, $R_{13}$ and $R_{15}$ each represents a hydrogen atom or a methyl group, and $n_2$ is an integer of 1 to 10.

17. The laminate as claimed in claim 5, wherein the halogen-containing flame retardant monomer is a mixture of (i) at least one of bromine-containing flame retardant monomers represented by formulae (VIII) and (IX)

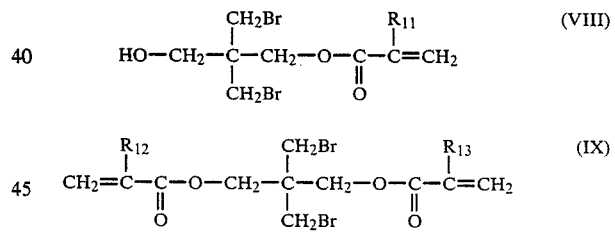

wherein $R_{11}$, $R_{12}$ and $R_{13}$ each represents a hydrogen atom or a methyl group, and (ii) a chlorine-containing flame retardant monomer represented by formula (XI)

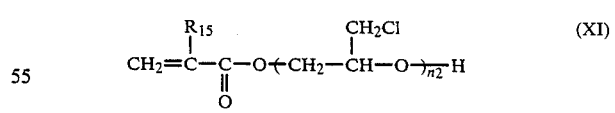

wherein $R_5$ is a hydrogen atom or a methyl group, and $n_2$ is an integer of 1 to 10, and the amount of the chlorine-containing flame retardant monomer is 50 to 200 wt% based on the total amount of the bromine-containing flame retardant monomers.

18. The laminate as claimed in claim 6, wherein the halogen-containing flame retardant monomer is a mixture of (i) at least one of bromine-containing flame retardant monomers represented by formulae (VIII) and (IX)

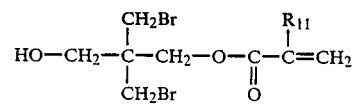

(VIII)

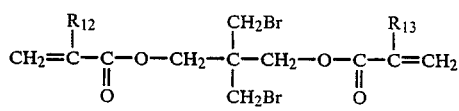

(IX)

wherein $R_{11}$, $R_{12}$ and $R_{13}$ each represents a hydrogen atom or a methyl group, and (ii) a chlorine-containing flame retardant monomer represented by formula (XI)

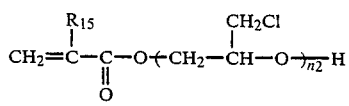

(XI)

wherein $R_{15}$ is a hydrogen atom or a methyl group, and $n_2$ is an integer of 1 to 10, and the amount of the chlorine-containing flame retardant monomer is 50 to 200 wt% based on the total amount of the bromine-containing flame retardant monomers.

19. The laminate as claimed in claim 7, wherein the halogen-containing flame retardant monomer is a mixture of (i) at least one of bromine-containing flame retardant monomers represented by formulae (VIII) and (IX)

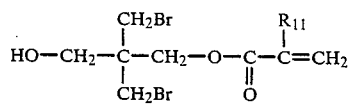

(VIII)

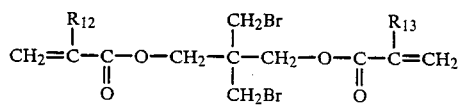

(IX)

wherein $R_{11}$, $R_{12}$ and $R_{13}$ each represents a hydrogen atom or a methyl group and (ii) a chlorine-containing flame retardant monomer represented by formula (XI)

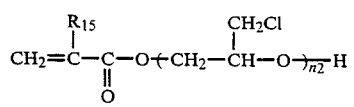

(XI)

wherein $R_{15}$ is a hydrogen atom or a methyl group, and $n_2$ is an integer of 1 to 10, and the amount of the chlorine-containing flame retardant monomer is 50 to 200 wt% based on the total amount of the bromine-containing flame retardant monomers.

20. The laminate as claimed in claim 8, wherein the halogen-containing flame retardant monomer is a mixture of (i) at least one of bromine-containing flame retardant monomers represented by formulae (VIII) and (IX)

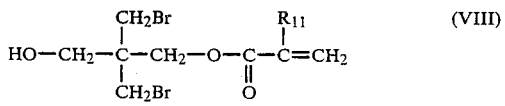

(VIII)

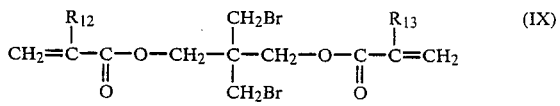

(IX)

wherein $R_{11}$, $R_{12}$ and $R_{13}$ each represents a hydrogen atom or a methyl group, and (ii) a chlorine-containing flame retardant monomer represented by formula (XI)

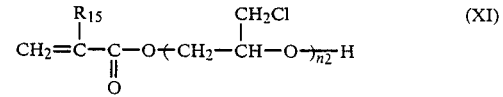

(XI)

wherein $R_{15}$ is a hydrogen atom or a methyl group, and $n_2$ is an integer of 1 to 10, and the amount of the chlorine-containing flame retardant monomer is 50 to 200 wt% based on the total amount of the bromine-containing flame retardant monomers.

21. The laminate as claimed in claim 5, wherein as the crosslinkable monomer, a felxibility-imparting monomer is contained in an amount of 0.1 to 40 wt% based on the total weight of the crosslinkable monomers, said flexibility-imparting monomer being represented by the general formula (XII)

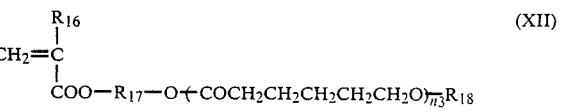

(XII)

wherein $R_{16}$ is a hydrogen atom or a methyl group, $R_{17}$ is a divalent aliphatic hydrocarbon group having 2 to 5 carbon atoms, $R_{18}$ is a hydrogen atom or a hydrocarbon group having 1 to 10 carbon atoms, and $n_3$ is an integer of 1 to 20.

22. The laminate as claimed in claim 1, wherein the curable composition is cured with an organic peroxide.

23. The laminate as claimed in claim 1, wherein the fibrous substrates are selected from the group consisting of glass fiber cloths, unwoven fabrics, paper made mainly of cellulose fiber, and asbestos.

* * * * *